United States Patent
Watanabe

(10) Patent No.: US 6,310,402 B1
(45) Date of Patent: Oct. 30, 2001

(54) SEMICONDUCTOR DIE HAVING INPUT/OUTPUT CELLS AND CONTACT PADS IN THE PERIPHERY OF A SUBSTRATE

(75) Inventor: Shinichiro Watanabe, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/344,494

(22) Filed: Jun. 25, 1999

(30) Foreign Application Priority Data

Jun. 26, 1998 (JP) .................................................. 10-180626

(51) Int. Cl.⁷ ..................................................... H01L 27/02
(52) U.S. Cl. ........................... 257/784; 257/782; 257/776; 257/783; 257/786; 257/773
(58) Field of Search ..................................... 257/787, 666, 257/668, 671, 782, 784, 776, 783, 773

(56) References Cited

U.S. PATENT DOCUMENTS

| | | | |
|---|---|---|---|
| 5,324,985 | * | 6/1994 | Hamada et al. ..................... 257/787 |
| 5,334,872 | * | 8/1994 | Ueda et al. ......................... 257/787 |
| 5,391,923 | * | 2/1995 | Harada ............................... 257/787 |
| 5,466,952 | * | 11/1995 | Aeba ................................... 257/48 |
| 5,506,444 | * | 4/1996 | Chikawa et al. .................... 257/787 |
| 5,719,445 | * | 2/1998 | McClure ............................. 257/723 |

* cited by examiner

Primary Examiner—Fetsum Abraham
(74) Attorney, Agent, or Firm—Rabin & Berdo, P.C.

(57) ABSTRACT

The width of an input/output forming region is matched with the minimum width adoptable as a layout interval between pads in advance. Pads corresponding to (least common multiple)÷(layout interval between pads) in number are disposed so as to correspond to input/output cells corresponding to (least common multiple)÷(width of input/output cell forming region) in number, based on the least common multiple between the width of each input/output cell forming region and the layout interval between the pads. Owing to such a construction, a semiconductor device can be provided which meets user demands with ease and in a short time.

20 Claims, 6 Drawing Sheets

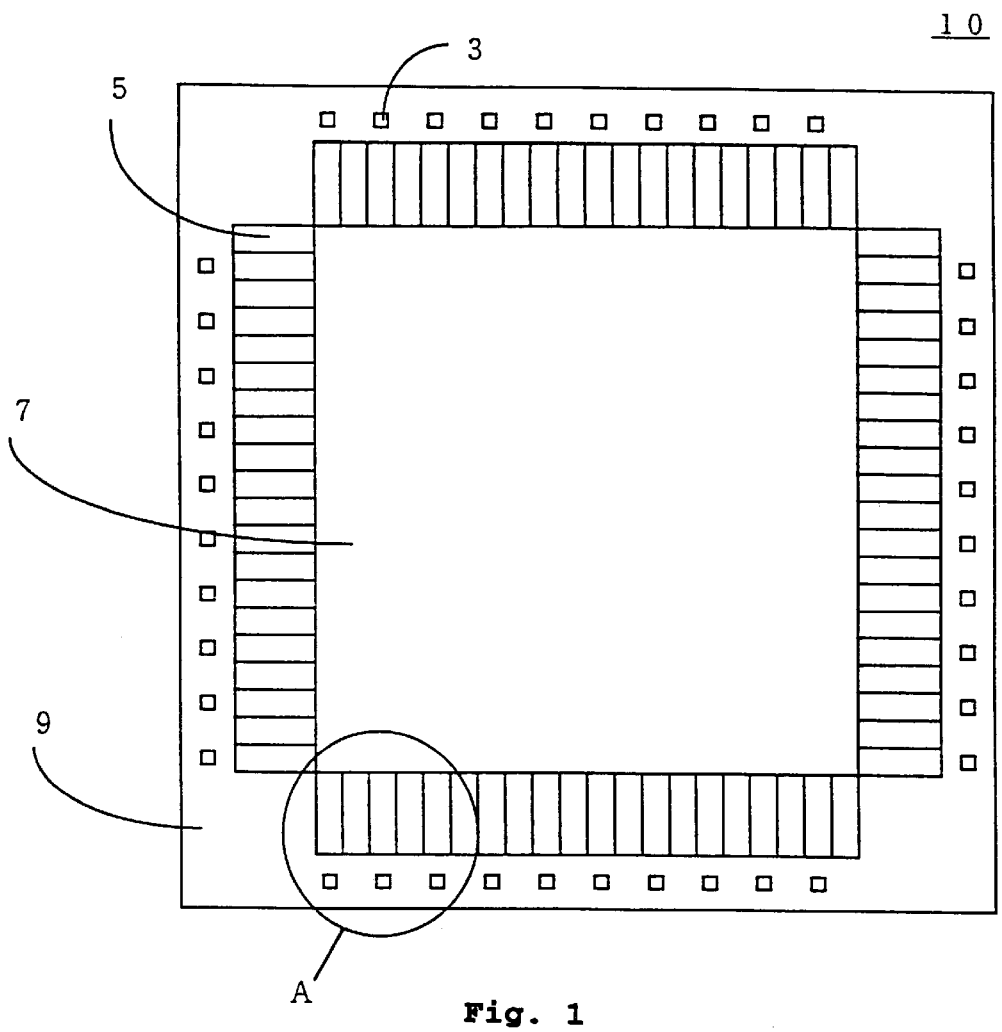
Fig. 1
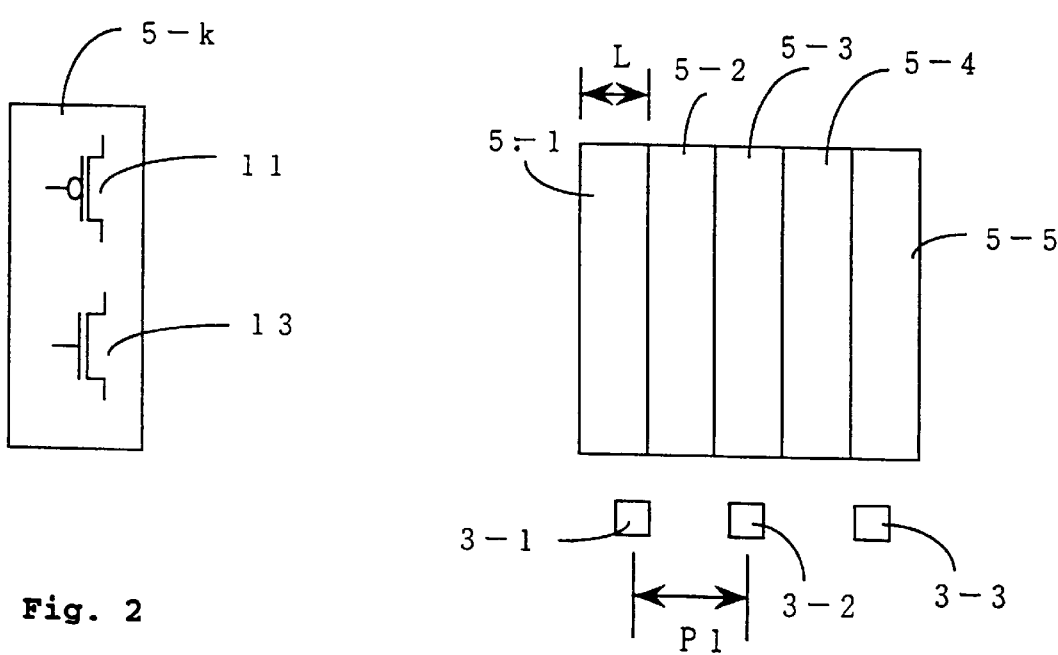
Fig. 2
Fig. 3

SEMICONDUCTOR DIE HAVING INPUT/OUTPUT CELLS AND CONTACT PADS IN THE PERIPHERY OF A SUBSTRATE

BACKGROUND OF THE INVENTION

1. Field of the Invention

This invention relates to a semiconductor device, and particularly to a layout of input/output cells employed in an ASIC (Application Specific Integrated Circuit) such as a gate array, an embedded array or the like.

2. Description of the Related Art

A semiconductor device, particularly an ASIC, makes various implementation demands according to the purposes of users in a short time, in terms of the time required for the development and manufacturing process. Since the ASIC is fabricated according to the purposes of the users, there is a tendency to use it in a wide variety of products.

The semiconductor devices are formed as the separate products according to the number of pads as follows. Pads are respectively placed at predetermined intervals according to the number of the pads therein. With respect to input/output cells having elements or devices for respectively forming input/output circuits in accordance with the pads, the widths (corresponding to lengths extending in the direction in which the pads are placed) are respectively determined according to the number of the pads and layout intervals between the respective pads. Therefore, even input/output cells that differ with regards to the size of the input/output cell forming region are prepared in the same circuit configuration in accordance with the number of the pads.

Thus, since even devices that differ with regards to the size of the input/output cell forming region are prepared, their fabrication and development are performed correspondingly and their fabrication and development costs are involved. Therefore, the conventional semiconductor devices do not always satisfy a user's demands with ease in terms of time and a reduction in cost.

With a multi-pin configuration of a semiconductor device, it becomes increasingly difficult to place a plurality of pads within a limited pad placement region in a row. As a countermeasure against this difficulty, a so-called zigzag pad arrangement is known in which pads are placed alternately closer to and further from input/output cells.

In this case, wires or interconnections for respectively connecting between the pads that are placed farther from the input/output cell side and the input/output cells become narrow in width, so that the amount of current allowable for each interconnection is reduced. Thus, since the amount of allowable current in this case becomes less than the amount of current allowable for the pads that are placed close to the input/output cell side, limitations are imposed on signals for objects which utilize the pads that are placed farther from the input/output cell side.

SUMMARY OF THE INVENTION

An object of the present invention is to provide a semiconductor device that meets a user's demands in terms of ease and time.

Further, the present invention implements the above object and further provides a reduction in the cost thereof.

Another object of the present invention is to achieve the above object by effectively utilizing input/output cells.

A further object of the present invention is to provide a semiconductor device capable of increasing the amount of current allowable for the interconnections placed between pads and input/output cells thereby to improve the degree of freedom of interconnections.

According to one aspect of this invention, for achieving the above objects, there is provided a semiconductor device comprising a plurality of pads placed at predetermined intervals, and a plurality of input/output cells that respectively have input/output circuit forming elements and that are electrically connected to the elements of any of the plurality of pads same line the widths of input/output cell forming regions extending in the direction of the placement of the plurality of pads are respectively narrower than layout intervals between the plurality of pads further the pads corresponding to a number equivalent to (least common multiple between the width of each input/output cell forming region and the layout interval between the pads) divided by the (layout interval between the pads are respectively connected to elements of any of the input/output cells corresponding to a number equivalent to (least common multiple between the width of each input/output sell forming region and the layout interval between the pads) divided by the (width of each input/output cell forming region.

In the present invention as well, the pads and input/output cells are respectively placed along predetermined sides of the semiconductor device. Pads may be provided even with respect to input/output cells equivalent to the remainder obtained by dividing the number of the plurality of input/output cells extending along the sides by a number corresponding to least common multiple between the width of each input/output cell forming region and the layout interval between the pads) divided by the (width of each input/output cell forming region.

Further, in the present invention, a plurality of pads and non-connected input/output cells may be used as a high-driven driver and protection circuits for a power supply interconnection, etc.

According to another aspect of this invention, for achieving the above objects, there is provided a semiconductor device comprising a plurality of pads that are placed at predetermined intervals and a plurality of input/output cells respectively having input/output circuit forming elements and that are electrically connected to elements of any of the plurality of pads. The plurality of pads comprise a first group placed in the vicinity of the input/output cells and a second group placed so as to be farther away from the first group as viewed from the input/output cells, and each of interconnections for respectively connecting the input/output cells in the second group and their corresponding pads has a multilayer interconnection structure.

In the present invention as well, the width of the interconnection for connecting between each input/output cell in the second group and its corresponding pad may be set narrower than that of an interconnection for connecting between each input/output cell in the first group and its corresponding pad.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 1 is a top view showing a semiconductor chip employed in a semiconductor device according to a first embodiment of the present invention.

FIG. 2 is a view of an input/output cell in FIG. 1.

FIG. 3 is an enlarged partial view of FIG. 1.

DETAILED DESCRIPTION OF THE PREFERRED EMBODIMENTS

Figure 4:
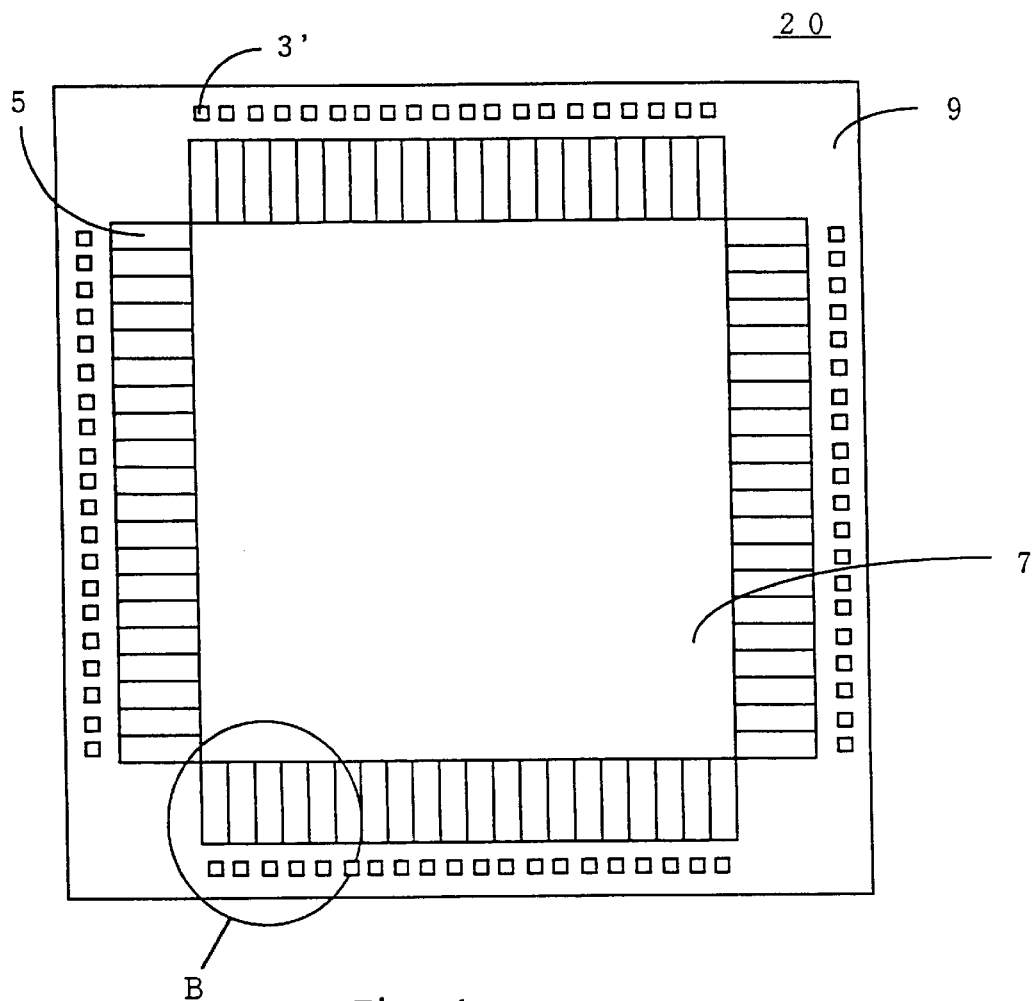
FIG. 4 is a top view showing an another semiconductor chip employed in a semiconductor device according to a first embodiment of the present invention.

Semiconductor devices according to the present invention will hereinafter be described with reference to the accompanying drawings. FIG. 1 is a top view showing a semiconductor chip employed in a semiconductor device according to a first embodiment of the present invention. FIG. 1 particularly illustrates one in which a gate array is used as an ASIC.

Referring to FIG. 1, the semiconductor chip 10 is shaped in of a substantially square configuration. The surface of the semiconductor chip 10 is divided into a main circuit region 7 formed substantially in the central area of the semiconductor chip 10, a region in which a plurality of input/output cells 5 formed around the main circuit region 7 are disposed, and a region 9 in which a plurality of pads 3 placed in the vicinity of the respective sides of the semiconductor chip 10 are formed.

Circuits (such as an arithmetic circuit, a counter, a central processing unit, etc.) for implementing functions which meet user demands, are formed in the main circuit region 7. In FIG. 1, the pads 3 are arranged line in along the respective sides. The input/output cells 5 are placed in line in the same direction as that in which the pads 3 are arranged.

FIG. 2 shows examples of elements or devices formed in an input/output cell 5-k (where k: positive integer). As shown in FIG. 2, a p-channel MOS transistor 11 and an n-channel MOS transistor 13 are formed in the input/output cell 5-k as devices. The two transistors 11 and 13 are wired so as to constitute an inverter, for example, which in turn can be used as an input circuit or an output circuit. Other input/output cells employed in the semiconductor chip 10 shown in FIG. 1 have similar devices. The input/output circuits respectively constructed of the input/output cells 5 and their corresponding predetermined pads 3 are electrically connected to one another by wires or interconnections. In this condition, signals can be transferred between the circuits in the main circuit region 7 and external devices through the input/output circuits and the pads 3.

Further p-channel MOS transistors and n-channel MOS transistors are provided one-by-one as the devices formed in each individual input/output cell 5 in FIG. 2. However, the devices are not necessarily limited to this arrangement. The p-channel and n-channel MOS transistors may be provided in plural form so as to constitute a plurality of inverters, for example. As shown in FIG. 2, the one-by-one provision of the p-channel and n-channel MOS transistors makes it possible to constitute each input/output circuit and minimize the area of a region for each input/output cell.

An enlarged view of portion A in FIG. 1 is shown in FIG. 3. As shown in FIG. 3, three pads 3-1 through 3-3 are disposed so as to correspond to five input/output cells 5-1 through 5-5. The width (corresponding to the length extending in the direction in which each pad is placed) L of each of the input/output cells 5-1 through 5-5 is 60100 $\mu$m, for example. A placement or layout interval (corresponding to the distance between the centers of the adjacent pads) P1 between the adjacent pads is set to 100 $\mu$m.

In other words, the relationship between the plurality of input/output cells and the plurality of pads shown in FIG. 1 is established so that the three pads are placed in association with the five input/output cells. According to this arrangement, since the width L of each input/output cell is set to 60 $\mu$m and the layout interval P1 between the pads is set to 100 $\mu$m, the least common multiple of the two values is 300 $\mu$m. Based on the least common multiple, pads corresponding to the number of the least common multiple) divided by the (layout interval P1 between the pads) are arranged in association with input/output cells corresponding to the number of least common multiple divided by the width L of each input/output cell. In other words, now consider that a plurality of input/output cells are placed with the minimum width L (corresponding to the minimum layout interval which allows the in-line arrangement of the pads) of each input/output cell having a possibility desired as a user demands in advance. If a layout interval P1 between desired pads is determined on this condition, then the least common multiple between the width L of each input/output cell and the layout interval P1 between the pads is determined, and pads corresponding to the number of the least common multiple divided by the layout interval P1 between pads are disposed in association with input/output cells corresponding to the number of the least common multiple divided by the width L of each input/output cell.

Since the least common multiple reaches 180 $\mu$m when it is desired to set the layout interval P1 between the pads as 180 $\mu$m, for example, by using the input/output cell width L of 60 $\mu$m as an example other than the above-described example, one pad is provided with respect to three input/output cells. It is desirable to set the width L of each input/output cell and the layout interval P1 between the pads to values for which it is easy to obtain the least common multiple.

Since the three pads 3-1 through 3-3 are disposed with respect to the five input/output cells 5-1 through 5-5 in FIG. 3, the pads 3-1 through 3-3 are respectively electrically connected to devices in any of the input/output cells 5-1 through 5-5 by interconnections. Therefore, the two input/output cells are electrically disconnected from any of the pads 3-1 through 3-3. The utilization of the disconnected or non-connected input/output cells will be described later.

FIG. 4 is a top view showing a semiconductor chip 20 at the time that a layout interval P1 between pads is set to 60 μm while the width L of each input/output cell remains held at 60 μm. Elements of structure shown in FIG. 4 similar to those shown in FIG. 1 are identified by the same reference numerals.

As shown in FIG. 4, pads 3' are provided so as to be greater than the pads 3 shown in FIG. 1 in number. Namely, since the least common multiple between the width of each input/output cell and the layout interval between the pads becomes 60 μm, one pad corresponds to one input/output cell.

Figure 5:
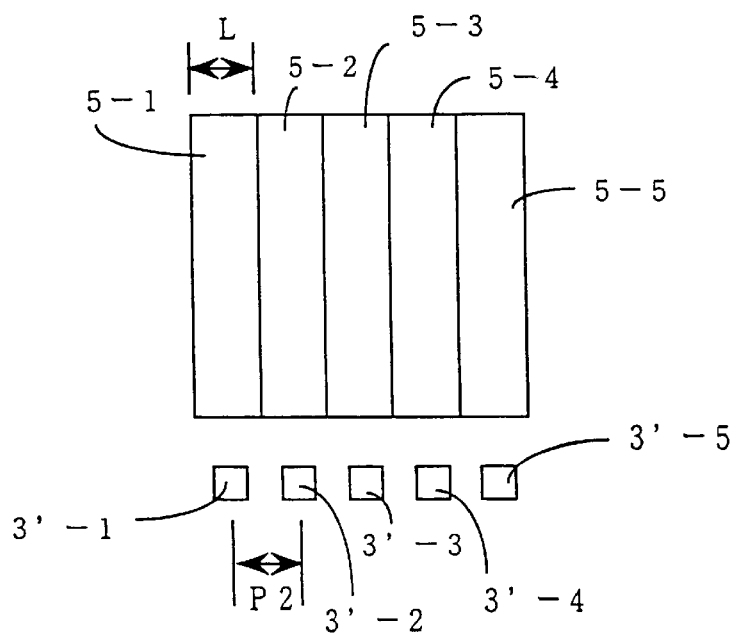
FIG. 5 is an enlarged partial view of FIG. 4.

An enlarged view of portion B in FIG. 4 is shown in FIG. 5. As shown in FIG. 5, five pads 3'-1 through 3'-5 are disposed so as to correspond to five input/output cells 5-1 through 5-5. The width L of each input/output cell is 60 μm and a layout interval P2 between the adjacent pads is 60 μm. Therefore, devices respectively formed in the five input/output cells 5-1 through 5-5 are electrically connected to the corresponding one of the five pads 3'-1 through 3'-5 by interconnections. In this case, input/output cells disconnected from the pads do not exist.

With the placement of the input/output cells in the semiconductor chip with the predetermined width of each input/output cell as described above, the width of each input/output cell is allowed to correspond to the layout interval between the plurality of pads. It is therefore unnecessary to develop and manufacture the input/output cells at every pad layout interval. As a result, a semiconductor device can be provided which meets user demands with ease and in a short time.

Referring now to FIG. 1, the width L of each input/output cell is 60 μm and the layout interval P1 between the adjacent pads is 100 μm. When the three pads are disposed in association with the five input/output cells, e.g., when the number of input/output cells arranged along predetermined sides of the semiconductor chip is 31 to 34, the input/output cells corresponding to 1 to 4 remain.

Figure 6:
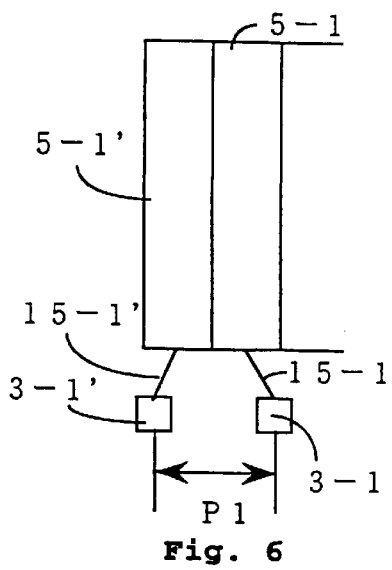
FIG. 6 is a view showing a first example to use in which input/output cells in FIG. 1 remained.

Coping with such a case will be shown in accordance with FIGS. 6 through 9. FIG. 6 shows an example in which one input/output cell remains. A pad 3-1' to be connected to devices formed in the remaining input/output cell 5-1' may be disposed as shown in FIG. 6. The input/output cell 5-1' can be electrically connected to the pad 3-1' by means of a wire or interconnection 15-1' for providing an electrical connection therebetween. A layout interval between the pad 3-1' and its adjacent pad 3-1 is set to P1 (=100 μm) similarly to the layout interval between other adjacent pads. In doing so, the remaining input/output cell can be used without waste.

Figure 7:
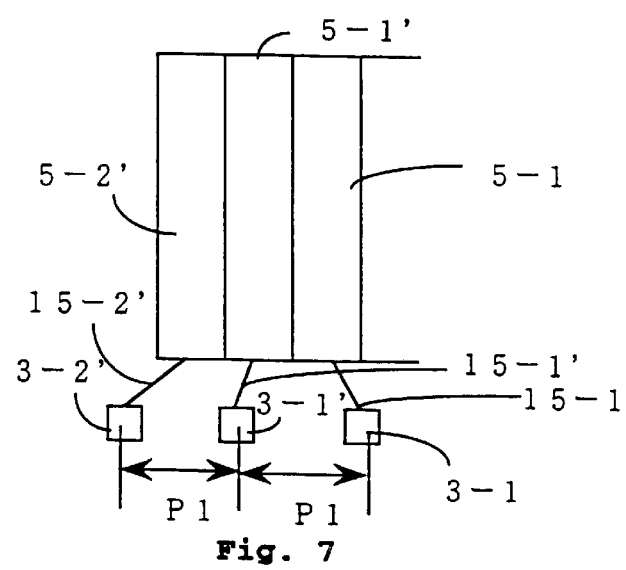
FIG. 7 is a view showing a second example to use in which input/output cells in FIG. 1 remained.

FIG. 7 shows an example in which two input/output cells remain. Pads 3-1' and 3-2' to be respectively connected to devices formed in the remaining input/output cells 5-1' and 5-2' may be disposed as shown in FIG. 7. The input/output cell 5-1' can be electrically connected to the pad 3-1' by means of an interconnection 15-1' for connecting between the two. The input/output cell 5-2' can be electrically connected to the pad 3-2' by means of an interconnection 15-2' for connecting therebetween. A layout interval between the pad 3-1' and its adjacent pad 3-1 and a layout interval between the pad 3-1' and its adjacent pad 3-2' are respectively set to P1 (=100 μm) similarly to the layout interval between other adjacent pads. By doing so, the remaining input/output cells can be utilized without waste.

Figure 8:
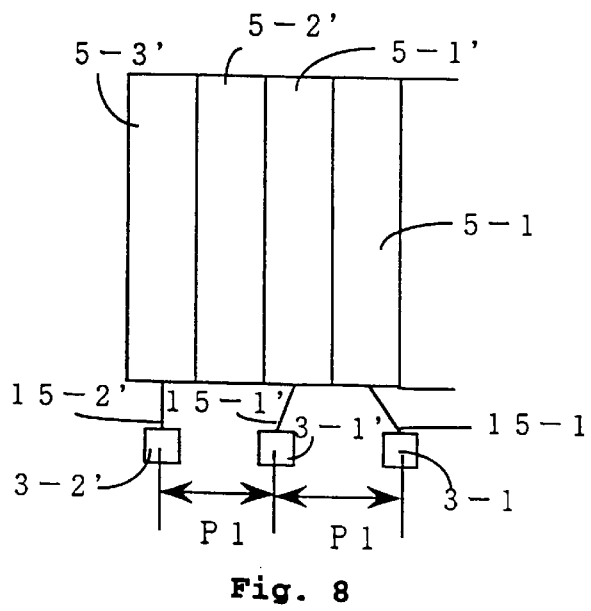
FIG. 8 is a view showing a third example to use in which input/output cells in FIG. 1 remained.

FIG. 8 shows an example in which three input/output cells remain. Pads 3-1' and 3-2' to be respectively connected to devices formed in the remaining input/output cells 5-1' through 5-3' may be disposed as shown in FIG. 8. The input/output cell 5-1' can be electrically connected to the pad 3-1' by means of an interconnection 15-1'. The input/output cell 5-3' can be electrically connected to the pad 3-2' by means of an interconnection 15-2'. A layout interval between the pad 3-1' and its adjacent pad 3-1 and a layout interval between the pad 3-1' and its adjacent pad 3-2' are respectively set to P1 (=100 μm) similarly to the layout interval between other adjacent pads. By doing so, the remaining input/output cells can be utilized without waste.

The reason why the two pads 3-1' and 3-2' are provided in the example shown in FIG. 8, is as follows: Since the third pad is further separated from the pad 3-2' by the layout interval P1, the distance between the third pad and the input/output cell 5-3' located at the outermost end closest to the third pad is kept at a long distance and thereby becomes greater than the length of an interconnection between each of the devices formed in other input/output cells and its corresponding pad with certainty. Therefore, the two pads are provided to avoid difficulty in laying out interconnections.

Figure 9:
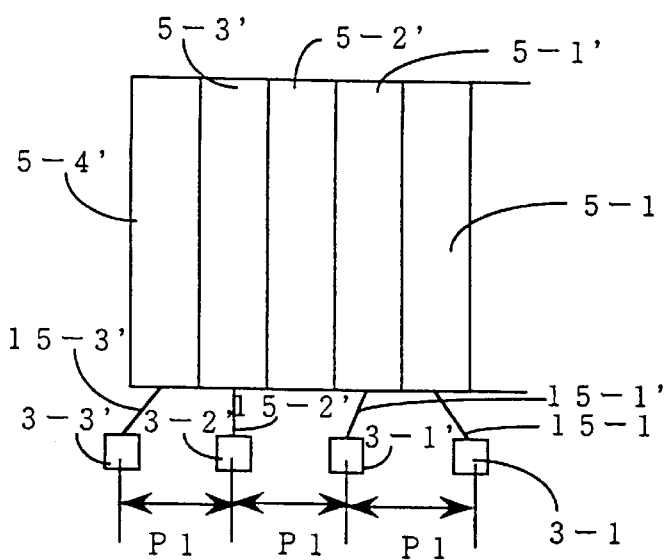
FIG. 9 is a view showing a fourth example to use in which input/output cells in FIG. 1 remained.

FIG. 9 shows an example in which four input/output cells remain. Pads 3-1' and 3-3' to be respectively connected to devices formed in the remaining input/output cells 5-1' through 5-4' may be disposed as shown in FIG. 9. The input/output cell 5-1' can be electrically connected to the pad 3-1' by means of an interconnection 15-1'. The input/output cell 5-3' can be electrically connected to the pad 3-2' by means of an interconnection 15-2'. The input/output cell 5-4' can be electrically connected to the pad 3-3' by means of an interconnection 15-3'. A layout interval between the pad 3-1' and its adjacent pad 3-1, a layout interval between the pad 3-1' and its adjacent pad 3-2', and a layout interval between the pad 3-2' and its adjacent pad 3-3' are respectively set to P1 (=100 μm) similarly to the layout interval between other adjacent pads. By doing so, the remaining input/output cells can be utilized without waste.

The provision of the pads placed at the layout intervals similar to the above even with respect to the remaining input/output cells as described above makes it possible to utilize the input/output cells without waste. This is easier to cope with a multi-pin configuration.

Since the three pads are disposed in association with the five input/output cells in the example shown in FIG. 1, the two input/output cells result in a non-connected state (corresponding to a state in which the devices formed in the input/output cells are not connected to the pads respectively).

Figure 10:
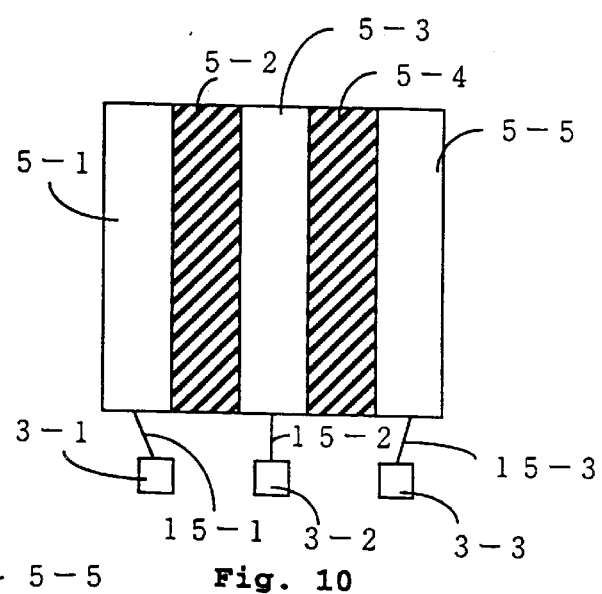
FIG. 10 is a view showing a non-connected input/output cell in FIG. 1.
Figure 11:
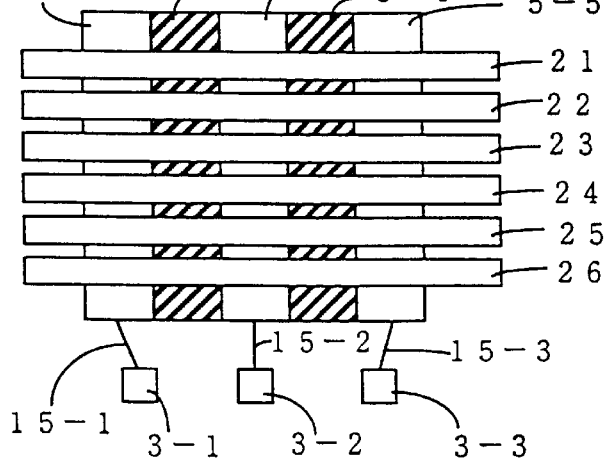
FIG. 11 is a view showing an example to use a nonconnected input/output cell in FIG. 1.

Coping with such a case will be described with reference to FIGS. 10 through 12. In FIG. 10, input/output cells 5-2 and 5-4 result in non-connected input/output cells. Other input/output cells are electrically connected to their corresponding pads by interconnections 15. In such a case, the devices formed in the input/output cells may be used as mostly-utilized high-driven drivers.

Two transistors in each individual input/output cells are respectively diode-coupled to one another so as to serve as two diodes, which in turn may be connected to respective interconnections as circuits for protecting against excessive voltages such as static electricity, etc. When a plurality of power interconnections 21 through 26 are provided at upper portions of input/output cells 5-1 through 5-5 including non-connected input/output cells 5-2 and 5-4 as shown in FIG. 11 by way of example, the non-connected input/output cells are used to constitute protection circuits and the protection circuits may be used for the power interconnections. Here, a source voltage Vdd1 is transferred to the interconnection 21, a source voltage Vdd2 is transferred to the interconnection 22, a source voltage Vdd3 is transferred to the interconnection 23, a ground voltage Vss1 is transferred to the interconnection 24, a ground voltage Vss2 is transferred to the interconnection 25, and a ground voltage Vss3 is transferred to the interconnection 26, respectively.

Figure 12:
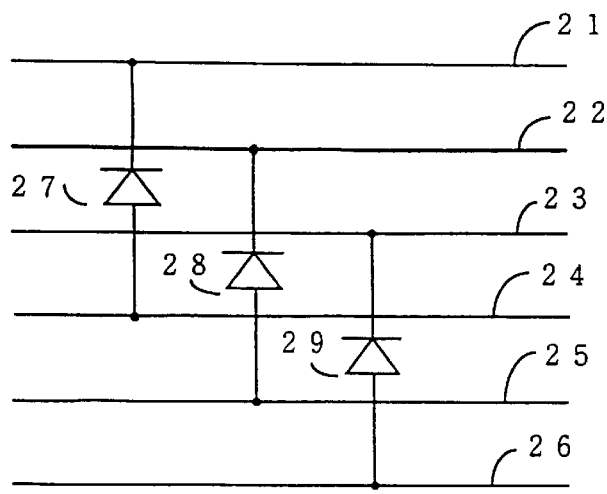
FIG. 12 is a circuit view showing an example to use a non-connected input/output cell in FIG. 1 as a protection circuit.

In this case, diodes 27, 28 and 29 may be electrically connected between the interconnections 21 and 24, between the interconnections 22 and 25 and between the interconnections 23 and 26 respectively as shown in FIG. 12. The diodes 27, 28 and 29 are respectively formed by devices formed in the non-connected input/output cell 5-2 or 5-4 shown in FIG. 11.

Thus, the non-connected input/output cells are also configured as other circuits. As a result, they can be utilized without waste. This is easier to cope with a multi-pin configuration.

A semiconductor device according to a second embodiment of the present invention will next be described with reference to the drawings. FIG. 2 is a partly enlarged view of the semiconductor device according to the second embodiment. The enlarged portion is placed in a position similar to that indicated by A in FIG. 1 or symbol B in FIG. 4.

Figure 13:
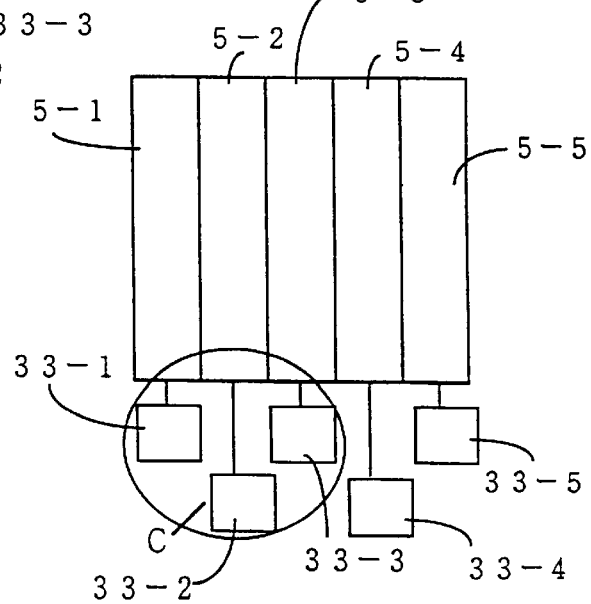
FIG. 13 is a partly enlarged view showing a semiconductor chip employed in a semiconductor device according to a second embodiment of the present invention.

Referring to FIG. 13, pads comprise a first group having pads 33-1, 33-3, 33-5 and the like arranged in line in the neighborhood of input/output cells 5-1 through 5-5, and a second group made up of pads 33-2, 33-4 and the like arranged in line away from the first group as viewed from the input/output cells 5-1 through 5-5. The pads placed in the vicinity of the input/output cells and the pads placed away from the pads as viewed from the input/output cells are provided in the form of an alternate arrangement, a so-called zigzag pad arrangement. Pads corresponding to the number greater than the number shown in FIG. 13 are provided even within the first and second groups although in part in FIG. 13 were considered as a semiconductor chip. Such pads are used where the pads are hard to be placed in line in a row with a multi-pin configuration.

Figure 14:
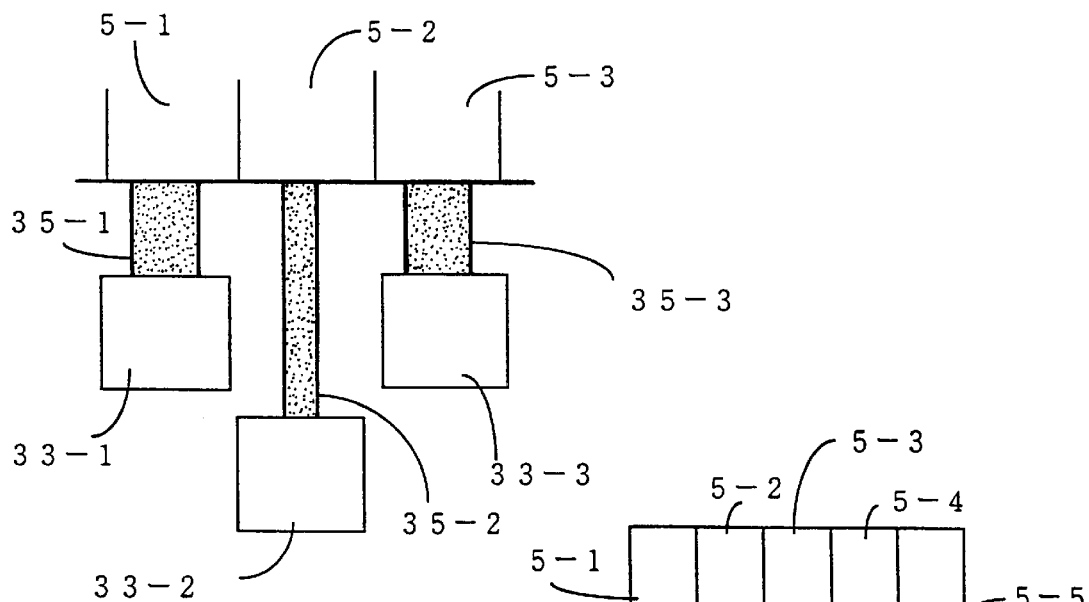
FIG. 14 is an enlarged partial view of FIG. 13.

A partly enlarged view indicated by C in FIG. 13 is shown in FIG. 14 as an enlarged view of FIG. 13. As shown in FIG. 14, the width of an interconnection 35-2 for connecting between the pad 33-2 placed away from the pads 33-1 and 33-3 as viewed from the corresponding input/output cells and the input/output cell 5-2 is narrower than the width of each of the interconnections 35-1 and 35-3 for respectively connecting between the pads 33-1 and 33-3 respectively placed in the neighborhood of their corresponding input/output cells and the input/output cells 5-1 and 5-3.

Figure 15:
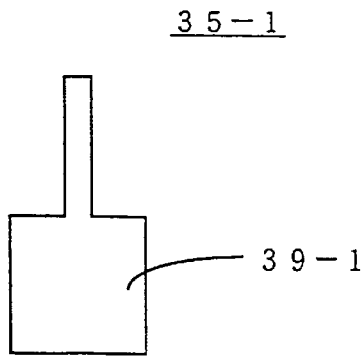
FIG. 15 is a view showing a composition of the wire 35-1 in FIG. 14.
Figure 16:
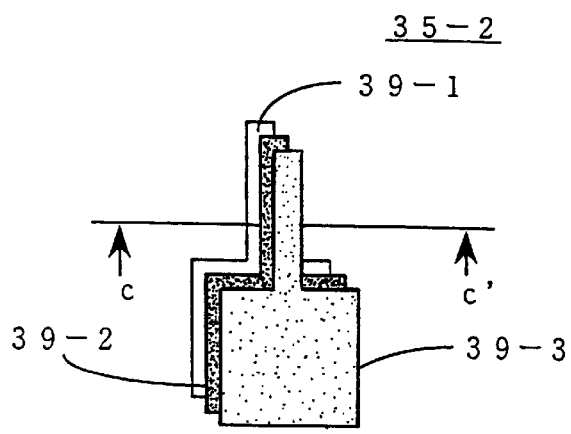
FIG. 16 is a view showing a composition of the wire 35-2 in FIG. 14.

Now, a wiring structure of the interconnection 35-1 and a wiring structure of the interconnection 35-2 will be typically illustrated in FIGS. 15 and 16 respectively. As shown in FIG. 15, the interconnection 35-1 makes use of a metal wired layer (e.g., the lowermost metal wired layer) corresponding to one layer of a multilayer interconnection (e.g., three-layered) structure. As shown in FIG. 16, the interconnection 35-2 utilizes metal wired layers 39-1 through 39-3 corresponding to three layers of the multilayer interconnection structure.

Figure 17:
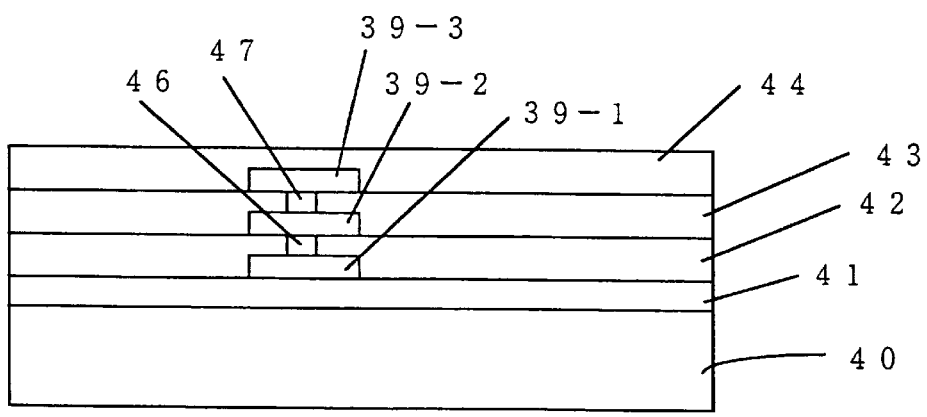
FIG. 17 is a view showing a structure of a sectional portion taken along line c–c' in FIG. 16.

A structure of a sectional portion taken along line c-c' in FIG. 16 will be shown in FIG. 17. In FIG. 17, the metal wired layer 39-1 corresponding to the lowermost layer is placed on an insulating layer 41 formed over a semiconductor substrate 40. The metal wired layer 39-2 corresponding to a middle layer is formed on an insulating layer 42. The metal wired layer 39-1 and the metal wired layer 39-2 corresponding to the middle layer are electrically connected to each other by a conductive material 46 provided within a contact hole defined in the insulating layer 42.

The metal wired layer 39-3 corresponding to the lowermost layer is formed on an insulating layer 43. The metal wired layers 39-2 and 39-3 are electrically connected to each other by a conductive material 47 provided within a contact hole defined in the insulating layer 43. A protective insulating layer 44 is formed over the metal wired layer 39-3.

Since the interconnection 35-2 whose width becomes narrow is formed of a plurality of wired layers having a multilayer interconnection structure as described above, the interconnection 35-2 can be set to the amount of allowable current similar to that of current allowable for each interconnection whose width is thicker than that of the interconnection 35-2. If the amount of current allowable for the interconnection 35-1 formed from one wired layer referred to above is regarded as 10 mA, then a current amount of 30 mA corresponding to three times the current amount of 10 mA can be expected as the amount of current allowable for the interconnection 35-2 formed from the three wired layers. In this case, the respective wired layers will be regarded as being similar in terms of configuration.

In the second embodiment as described above, since an interconnection whose width is narrow is constructed of a plurality of wired layers having a multilayer interconnection structure, such a construction can cope with a multi-pin configuration and the amount of current allowable for the interconnection between a pad and its corresponding input/output cell can be increased. Therefore, the amount of allowable current is kept in balance between first and second groups comprised of pads. Restrictions on the pads by the amount of allowable current can be eliminated upon connection to an external device. It is therefore possible to improve the degree of freedom of each interconnection.

Although the present invention has been described above in detail, the present invention is by no means limited to the above-described embodiments.

For example, the layout of the pads employed in the first embodiment may be applied to the zigzag pads employed in the second embodiment. The first embodiment has described as an example the case in which the three pads are provided so as to correspond to the five input/output cells. However, the present invention is not necessarily limited to this. As a matter of course, a combination of other numbers may also occur based on the least common multiple between the width of each input/output cell and the layout interval between the pads.

While FIGS. 6 through 9 have described the case in which one to four input/output cells remain, additional pads can similarly be provided to cope with even the case in which five or more input/output cells remain.

While the second embodiment has described the case in which the three wired layers are used as the wired layers, two wired layers or three or more wired layers may be utilized. Further, interconnections thick in wiring width are not limited to the structure made up of one wired layer. Namely, if an interconnection narrow in wiring width rather than the interconnections thick in wiring width is formed by many wired layers, then effects of the invention by the second embodiment can be brought about.

Further, the aforementioned embodiment has described the gate array as an example. However, if another ASIC and a semiconductor device in which a plurality of input/output circuit element regions and a plurality of pads are placed in line, are adopted, then the present invention can be applied thereto.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor device including a semiconductor chip having a central area, a peripheral area that surrounds said central area and four sides that bound said peripheral area, said semiconductor chip comprising:
    a main circuit region formed in the central area of said semiconductor chip;
    a plurality of input/output cells in said peripheral area of said semiconductor chip, wherein said input/output cells a re arranged in rows that are each parallel to a respective one of said four sides of said semiconductor chip, and each of said input/output cells has a width of a length n that extends in the direction in which the respective row extends;
    a plurality of pads in an exterior portion of said peripheral area of said semiconductor chip beyond said input/output cells, wherein said pads are arranged in rows that are parallel to respective rows of said input/output cells, and wherein a layout interval between the center of adjacent pads in each of said rows is a distance m; and
    a plurality of interconnections, each of which electrically connects one of said plurality of pads to one of said plurality of input/output cells.

2. A semiconductor device according to claim 1, wherein a ratio of n:m is 1:1.

3. A semiconductor device according to claim 1, wherein a ratio of n:m is 3:5.

4. A semiconductor device according to claim 1, wherein said input/output cells include free cells that are not electrically connected to any of said plurality of pads.

5. A semiconductor device according to claim 4, wherein a high-driven driver is formed in each of said free cells.

6. A semiconductor device according to claim 4, wherein a protection circuit is formed in each of said free cells.

7. A semiconductor device according to claim 1, wherein said plurality of pads are arranged in corresponding first lines and second lines, wherein each of said first lines is arranged in parallel to a respective row of said input/output cells and each of said second line is disposed external to a corresponding first line of said plurality of pads.

8. A semiconductor device according to claim 7, wherein each of said plurality of pads in a respective one of said first lines is connected to one of said input/output cells in a corresponding row of input/output cells by a first conductive line and each of said pads in the respective first line has a first width, and wherein each of said plurality of pads in a respective one of said second lines is connected to one of said input/output cells in the corresponding row of input/output cells by a second conductive line and each of said pads in the respective second line has a second width that is narrower than the first width.

9. A semiconductor device according to claim 8, wherein said first conductive line includes a single conductive layer and said second conductive line includes a plurality of conductive layers.

10. A semiconductor device according to claim 1, wherein each of said input/output cells includes a transistor.

11. A semiconductor application specific integrated circuit (ASIC) device including a semiconductor chip having a central area and a peripheral area that surrounds said central area, said semiconductor chip comprising:
    a main circuit forming region formed in said central area of said semiconductor chip;
    a plurality of input/output cells arranged in a line within said peripheral area of said semiconductor chip, and each of said input/output cells has a width n;
    a plurality of pads formed in said peripheral area of said semiconductor chip beyond said input/output cells, wherein a layout interval between the center of adjacent pads is a distance m; and
    a plurality of interconnections, each of which electrically connects one of said plurality of pads to one of said input/output cells.

12. A semiconductor device according to claim 11, wherein a ratio of n:m is 1:1.

13. A semiconductor device according to claim 11, wherein a ratio of n:m is 3:5.

14. A semiconductor device according to claim 11, wherein said input/output cells include free cells, which are not electrically connected to any of said plurality of pads.

15. A semiconductor device according to claim 14, wherein a high-driven driver is formed in each of said free cells.

16. A semiconductor device according to claim 14, wherein a protection circuit is formed in each of said free cells.

17. A semiconductor device according to claim 11, wherein said plurality of pads are arranged in a first and a second line.

18. A semiconductor device according to claim 17, wherein each of said plurality of pads in said first line is connected to one of said input/output cells by a first conductive line having a first width, and each of said plurality of pads in said second line is connected to one of said input/output cells by a second conductive line having a second width which is narrower than the first width.

19. A semiconductor device according to claim 18, wherein said first conductive line includes a single conductive layer and said second conductive line includes a plurality of conductive layers.

20. A semiconductor device including a semiconductor chip having a peripheral area that surrounds said central area, said semiconductor chip comprising:
    a main circuit forming region formed in said central area;
    a plurality of input/output cells arranged in a line within said peripheral area, each of said cells having a same width and including a semiconductor element;
    a plurality of pads formed in said peripheral area beyond said cells, wherein a layout interval between the centers of each adjacent pair of the pads is a same distance; and
    a plurality if conductors, each electrically connecting one of said plurality of pads to one of said cells.

* * * * *